United States Patent [19]

Roberts et al.

[11] Patent Number: 5,142,695
[45] Date of Patent: Aug. 25, 1992

[54] CELLULAR RADIO-TELEPHONE RECEIVER EMPLOYING IMPROVED TECHNIQUE FOR GENERATING AN INDICATION OF RECEIVED SIGNAL STRENGTH

[75] Inventors: Glyn Roberts; Kiomars Anvari, both of Calgary, Canada

[73] Assignee: NovAtel Communications, Ltd., Calgary, Canada

[21] Appl. No.: 672,848

[22] Filed: Mar. 21, 1991

[51] Int. Cl.$^5$ .......................... H04B 1/38; H04B 1/06
[52] U.S. Cl. .................................. 455/89; 455/234.1; 379/60
[58] Field of Search ............... 455/234, 186, 239, 245, 455/226, 38, 70, 89, 90, 33; 375/98; 379/60

[56] References Cited

U.S. PATENT DOCUMENTS

| | | | |
|---|---|---|---|
| 4,619,002 | 10/1986 | Thro | 455/234 |
| 4,747,065 | 5/1988 | West | 375/98 |
| 4,868,885 | 9/1989 | Perry | 455/226 |
| 4,905,305 | 2/1990 | Garner et al. | 455/186 |

Primary Examiner—Curtis Kuntz
Attorney, Agent, or Firm—Cesari and McKenna

[57] ABSTRACT

In a digital radio-telephone receiver, an open-loop arrangement for generating a received-signal-strength-indicating ("RSSI") value suitable for use in mobile assisted hand-off within a cellular telephone system. The receiver has an amplifier for amplifying a received signal with a gain controlled by a gain-control signal, and an automatic-gain-control circuit ("AGC") responsive to the amplitude of the amplifier output and coupled in a feedback-loop for applying an AGC signal to the amplifier as the gain-control signal. An RSSI value is generated by (i) opening the AGC feedback loop so that the AGC output signal is not applied to the amplifier, (ii) applying a ramp signal of increasing amplitude to the VGA while the AGC monitors the signal envelope, and (iii) when the signal envelope passes a preselected threshold, applying the then-occurring ramp-signal value to a calibrated look-up table to obtain the corresponding RSSI value stored therein. Preferably, the receiver also employs a digital multiplexer ("MUX"), which provides to the amplifier as the gain-control signal, in response to a select signal, the ramp signal during a first period of time, and the AGC signal during a second period of time.

14 Claims, 3 Drawing Sheets

CELLULAR RADIO-TELEPHONE RECEIVER EMPLOYING IMPROVED TECHNIQUE FOR GENERATING AN INDICATION OF RECEIVED SIGNAL STRENGTH

FIELD OF THE INVENTION

The invention relates to telecommunication, and more particularly to improved techniques suitable for use in digital radio-telephones for generating received signal strength values for use in determining hand-offs between cells of a cellular telephone system.

BACKGROUND OF THE INVENTION

A known digital mobile radio-telephone receiver employs a tunable synthesizer for tuning the receiver to a selected channel, a variable gain amplifier ("VGA") for amplifying a radio-frequency signal received over the selected channel (or an intermediate-frequency signal derived therefrom), a demodulator for generating baseband signals from the amplifier output, an analog-to-digital converter ("ADC") for generating digital versions of the baseband signals, and a decoder for recovery of data from the digital baseband signals.

The recovered data can represent either message information, e.g., voice or data information, or control information. Voice-type message information is presented typically to a vocoder (i.e., a voice decoder) for recovery of a voice signal. Control information is provided typically to a central processing unit in the radio-telephone.

The radio-telephone also has an automatic gain control circuit ("AGC"). The AGC forms a closed feedback loop for generating an AGC control signal from the digital baseband signal, and applying the AGC signal to a control input of the VGA to adjust the amplifier gain. A programmable gain amplifier is a version of a VGA, in which the amplifier gain is restricted to discrete steps, and the AGC control signal selects the desired gain.

The AGC signal attempts to maintain the amplitude of the envelope of the digital baseband signals constant, and is therefore indicative of the received signal strength. The VGA gain is adjusted whenever the envelope levels rise above or drop below selected thresholds, thus maintaining the VGA output within a range of amplitudes that are adequate for processing purposes in the downstream components described above.

Adjusting the amplification gain is necessary because the received signal typically varies in strength (i.e., field strength or energy) over time. The strength of received signals varies in response to propagation conditions that vary, e.g., signal path variations resulting from movement of an automobile carrying the radio-telephone.

Propagation conditions that adversely affect signal strength include (a) physical obstructions in the propagation paths of the signals, (b) constructive and destructive interference of multiple signals caused by signal reflections from buildings and other objects, and (c) varying distances between mobile units and base stations.

As mentioned above, the AGC signal, in addition to controlling the VGA gain, is used in generating values indicative of the strengths of the received signals, i.e., received-signal-strength-indicating ("RSSI") values.

For purposes of generating an RSSI value, the above-described AGC feedback loop is closed and allowed to settle, i.e., to reach equilibrium, while the AGC signal controls the VGA gain so as to maintain the baseband signal envelope within the limits of a pre-selected range (e.g., 0 dB+/−0.5 dB). The feedback signal value occurring after a preselected length of time, which is long enough to assure that equilibrium has been reached, is used as a pointer into a calibrated look-up table stored on board the mobile unit to identify the corresponding RSSI value stored therein. This value is applied to the mobile radio-telephone transmitter for up-loading to the current base station.

RSSI values are used in cellular telephone systems, for instance, in a process called hand-off. As a mobile radio-telephone moves within the service area of the cellular system, communication control is handed-off between base stations in the system in order to maintain adequate signal strength for good-quality transmission and reception. In other words, hand-off is the passing of radio-telephone service during a telephone call from a current base station, which is acting as the intermediary for the call, to another base station in a geographically adjacent cell.

In mobile-assisted hand-off ("MAHO"), for instance, the mobile radio-telephone involved in the call participates in hand-off decisions. The mobile radio-telephone receiver periodically tunes to the frequencies of specified control channels of base stations of the geographically adjacent cells, and, for each channel, measures the strength of received control signals, i.e., generates RSSI values for those signals, and transfers or up-loads the RSSI values for the control channels to a central controller for the cellular telephone system via the current base station. The system controller uses the RSSI values in determining when a hand-off to a base station of an adjacent cell is required, and to which cell the mobile radio-telephone should be given. These decisions are sometimes called "locating."

In known cellular systems employing MAHO and designed for digital radio-telephones, the length of time available for RSSI data collection is short. In such systems, in order for each base station to handle calls to or from a number of (e.g., three) mobile radio-telephones at once, the base station time multiplexes communication with each. This means that the base station communicates periodically, one after the other, with each mobile radio-telephone.

Specifically, each of the three mobile radio-telephones operates serially in three time slots (called RECEIVE, IDLE, and TRANSMIT). The duration of each time slot is prescribed by international standards. During the RECEIVE time slot, which lasts, for instance, about 6.7 msec, the mobile radio-telephone receiver demodulates the communication signal received over an active subscriber channel.

During the IDLE and TRANSMIT intervals, the mobile radio-telephone receiver performs RSSI data collection, i.e., tunes to the frequencies of control channels of adjacent cells, allows its AGC feedback loop to settle, generates RSSI values, and re-tunes to its subscriber channel for ordinary communication during the RECEIVE time slot. This all must take place in a short period of time, for instance, about 13.4 msec, a requirement that is difficult to meet.

This requirement is especially difficult to meet when the received signal suffers the effects of rapid fading, common in the cellular environment. Furthermore, the more time used in generating the RSSI values, the less is available for tuning of the synthesizer among control and subscriber channels within the allowed period of time.

Thus, the time constraints on RSSI data collection impose designs constraints on the AGC circuit and the frequency synthesizer of the receiver. These design constraints increase the cost of the design and implementation of these receiver components.

SUMMARY OF THE INVENTION

Briefly, the invention resides in a digital radio-telephone receiver employing an open-loop arrangement for generating a received-signal-strength-indicating ("RSSI") value suitable for use in mobile assisted handoff ("MAHO") within a cellular telephone system.

The receiver has a variable-gain amplifier for amplifying a received signal with its gain controlled by a gain-control signal, and an automatic-gain-control circuit coupled in a feedback-loop ("AGC") for applying the gain-control signal to the amplifier. The gain control signal is responsive to the amplitude of the signal envelope of the amplifier output and causes the amplifier to maintain the output signal envelope within a particular range.

In accordance with the invention, an RSSI value is generated by (i) opening the AGC feedback loop so that the AGC output signal is not applied to the amplifier, (ii) applying a ramp signal of increasing amplitude to the gain-control terminal of the amplifier while the AGC monitors the signal envelope, and (iii) when the signal envelope passes a pre-selected threshold, applying the then-occurring ramp-signal value to a calibrated look-up table to obtain the corresponding RSSI value stored therein.

Preferably, the receiver also employs a digital multiplexer ("MUX"), which provides to the amplifier as the gain-control signal, in response to a select signal, the ramp signal during a first period of time, and the AGC signal during a second period of time.

More specifically, in the RECEIVE time slot when the receiver is demodulating communication signals received over an active subscriber channel, the select signal causes the MUX to pass the AGC signal to the VGA. On the other hand, in the TRANSMIT and IDLE time slots, the select signal causes the MUX to pass the ramp signal to the VGA and an RSSI value is obtained therefrom for MAHO, as described above. In generating RSSI values within the time available in the IDLE and TRANSMIT time slots, the ramp signal is synchronized to the start of the IDLE time slot, and delayed to allow the synthesizer to tune to a particular control channel. The ramp increases at such a rate as to reach its maximum value with adequate time remaining to allow the sythesizer time to re-tune back to the active subscriber channel.

Select and synchronizing signals are provided by a central processing unit in the radio-telephone, and are generated in response to information obtained from the control channel signal that identifies the starting and ending times of the time slots, i.e., RECEIVE, IDLE and TRANSMIT.

The foregoing approach can readily supply RSSI values in the time allotted for such measurements during the TRANSMIT and IDLE time slots, and can even provide additional time from that allotted for synthesizer frequency switching. This permits the use of less expensive frequency synthesizers.

In addition, the AGC feedback loop can readily generate, within the time allotted in the RECEIVE time slot, the AGC signal for use as the VGA control signal, so as to assure optimal control of the VGA during demodulation.

Thus, in the preferred embodiment, the closed feedback technique is used for optimal control of the VGA during the period of time when such control is desirable, and the open-loop technique is used to satisfy the more stringent time constraints extant in other periods of time.

Furthermore, a less robust AGC can be used than that in the above-described conventional approach, where the AGC is used also in RSSI data collection for MAHO, since the received communication signals typically have strengths within a narrower (e.g., 40 dB to 50 dB) range of uncertainty than that for the control channel signals (e.g., 70 to 100 dB) from which RSSI values are derived. Because of this, a less expensive AGC can be used.

BRIEF DESCRIPTION OF THE DRAWINGS

The aforementioned aspects, features and advantages of the invention, as well as others, are explained in the following description taken in connection with the accompanying drawings, wherein.

DESCRIPTION OF PREFERRED EMBODIMENT

Figure 1:
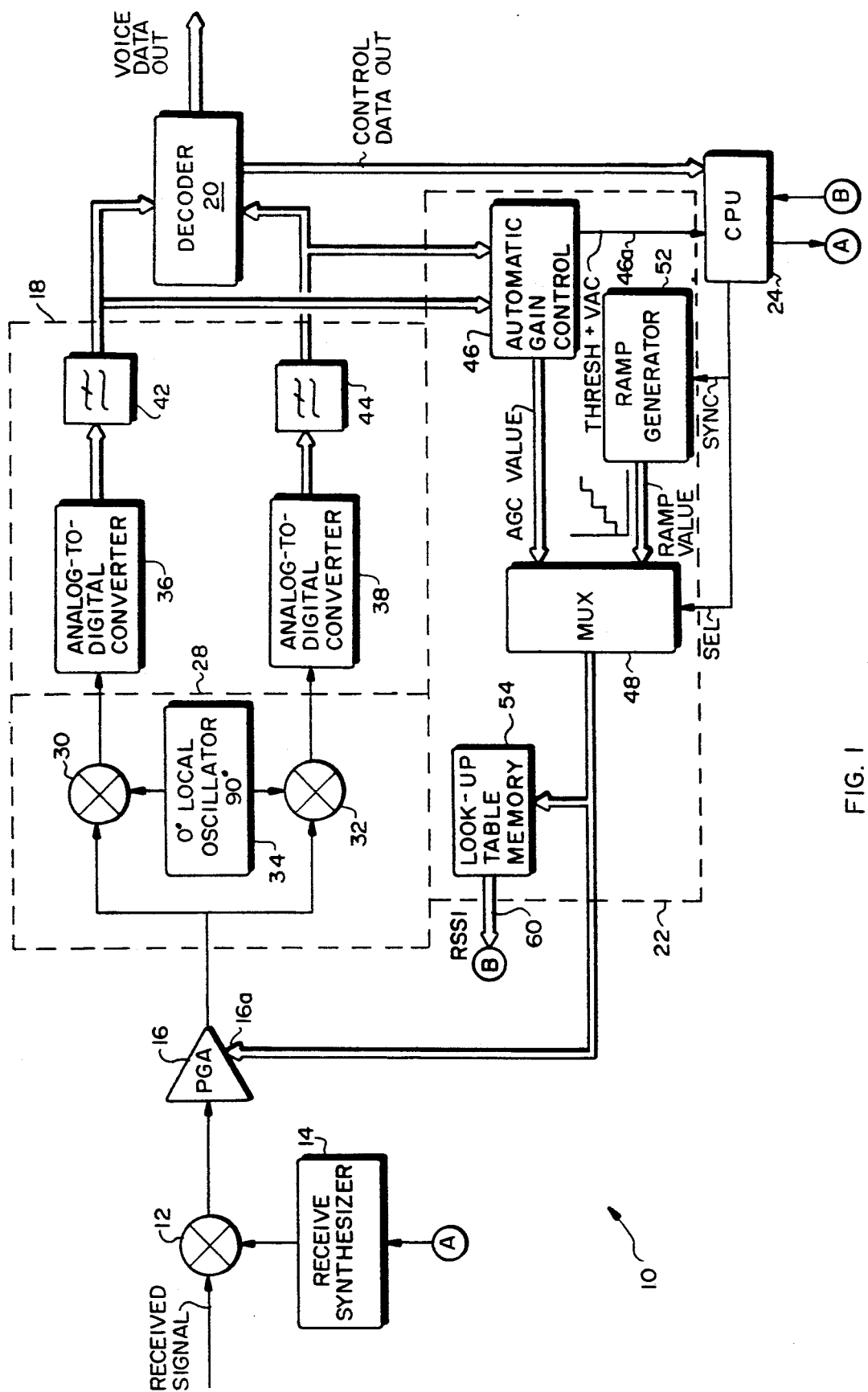
FIG. 1 is a block diagram of a digital radio-telephone receiver employing an improved technique for generating RSSI values in accordance with the invention.

FIG. 1 shows a digital radio-telephone receiver 10, which recovers digital data from a received digitally encoded, quadrature-modulated radio-frequency signal. The radio-telephone receiver 10 has a front-end mixer 12, a frequency synthesizer 14, a variable gain amplifier ("VGA") 16, a demodulating-and-signal-processing circuit 18, a decoder 20, an AGC-and-RSSI-values generating arrangement 22, and a central-processing-unit ("CPU") 24.

The front-end mixer 12 mixes the received signal with a locally generated signal from the frequency synthesizer 14 for tuning the receiver 10 to a selected channel. The output of the front-end mixer 12 is a signal having a selected frequency spectrum centered on a selected intermediate frequency. The frequency of the locally generated signal is, determined by a control signal received by the frequency synthesizer 14 from the CPU 24.

The VGA 16 amplifies the output of the front-end mixer 12 with a gain controlled by a VGA control signal received at a VGA control input 16a from the AGC-and-RSSI-values generating arrangement 22. The generation of the VGA control signal is described in detail below.

The demodulating and signal processing circuit 18 includes a frequency-converting circuit 28 having first and second mixers 30, 32 and a local oscillator 34. Each of the mixers 30, 32 combines the amplified signal from the VGA 16 with one of two orthogonally-related signals (i.e., two analog signals that are 90 degrees apart in phase) supplied by the local oscillator 34 to generate orthogonally-related analog baseband signals.

The analog baseband signals are applied to separate circuit paths, called the "I" (in-phase) and "Q" (quadrature) channels, where these signals are converted into digital baseband signals by ADC's 36, 38, and processed by DSP's 42, 44, respectively. The DSP's 42, 44 perform baseband-match-filter functions and demodulate the digital signals from the ADC's 36, 38, thereby generating demodulated digital baseband signals, called RECEIVE_I and RECEIVE_Q.

The decoder 20 serves to decode RECEIVE_I and RECEIVE_Q using, essentially, the reverse of an encoding algorithm (e.g., phase shift keying) employed by the transmitter (not shown), thereby recovering the data. The recovered data is either message information, which is presented to a vocoder (not shown) for recovery of a voice signal, or control information, which is provided to the central processing unit 24 in the receiver 10.

The AGC-and-RSSI-values generating arrangement 22 includes an automatic gain control circuit ("AGC") 46, a digital multiplexer ("MUX") 48, a ramp generator 52, and a calibrated look-up table stored in a memory 54.

The AGC 46 receives RECEIVE_I and RECEIVE_Q from the DSP 42, 44, combines these signals, monitors the signal envelope of the combined signals, and generates an AGC signal responsive to the amplitudes of the signal envelope, and therefore, of the received signal. The AGC signal is applied to a first input of the MUX 48.

The ramp generator 52 generates a ramp signal, i.e., a signal having a generally increasing amplitude over a preselected period of time. For example, the ramp generator 52 can be in the form of a digital counter, in which case the ramp signal comprises a series of steps of increasing amplitude, as shown at the output of the ramp generator 52 in FIG. 1. The ramp signal is applied to a second input of the MUX 48.

In response to a select signal SEL, MUX 48 passes either the AGC signal or the ramp signal to the VGA 16 as the VGA control signal. The select signal is provided by the CPU 24. The CPU 24 also controls the start and end of the ramp signal by means of a timing signal SYNC applied to the ramp generator. The select and timing signals will be described in greater detail below.

In addition to providing the control signal to the VGA, the MUX 48 applies the control signal to the look-up table memory 54. The look-up table stored therein contains a plurality of potential or candidate RSSI values that are each cross-referenced for calibration with a corresponding VGA control signal value. The stored candidate RSSI values referenced by VGA control signal values are applied to an RSSI output line 60 leading to the CPU 24. The CPU 24 derives a valid RSSI value from the received candidate RSSI values for transmission to a base station (not shown).

More specifically, in accordance with a preferred practice of the invention, in response to the CPU 24 asserting SEL (e.g., causing SEL to assume a BINARY ONE value), the MUX 46 passes the then-prevailing ramp signal to the control input 16a of the VGA 16, and, in so doing, also opens the AGC feed-back loop. The MUX 46 also applies the ramp value to the memory 54, where the look-up table converts the ramp values into candidate RSSI values.

Meanwhile, the AGC 24 monitors the envelope of the filtered baseband signals. When the envelope passes a selected threshold level (e.g., 0 dB+/−0.5 dB), the AGC 24 asserts a signal, THRESH-VAL, over line 46a to the CPU 24. In response to THRESH-VAL being asserted, the CPU 24 treats the candidate RSSI value that is then being asserted over line 60 as a valid RSSI value.

Figure 2:
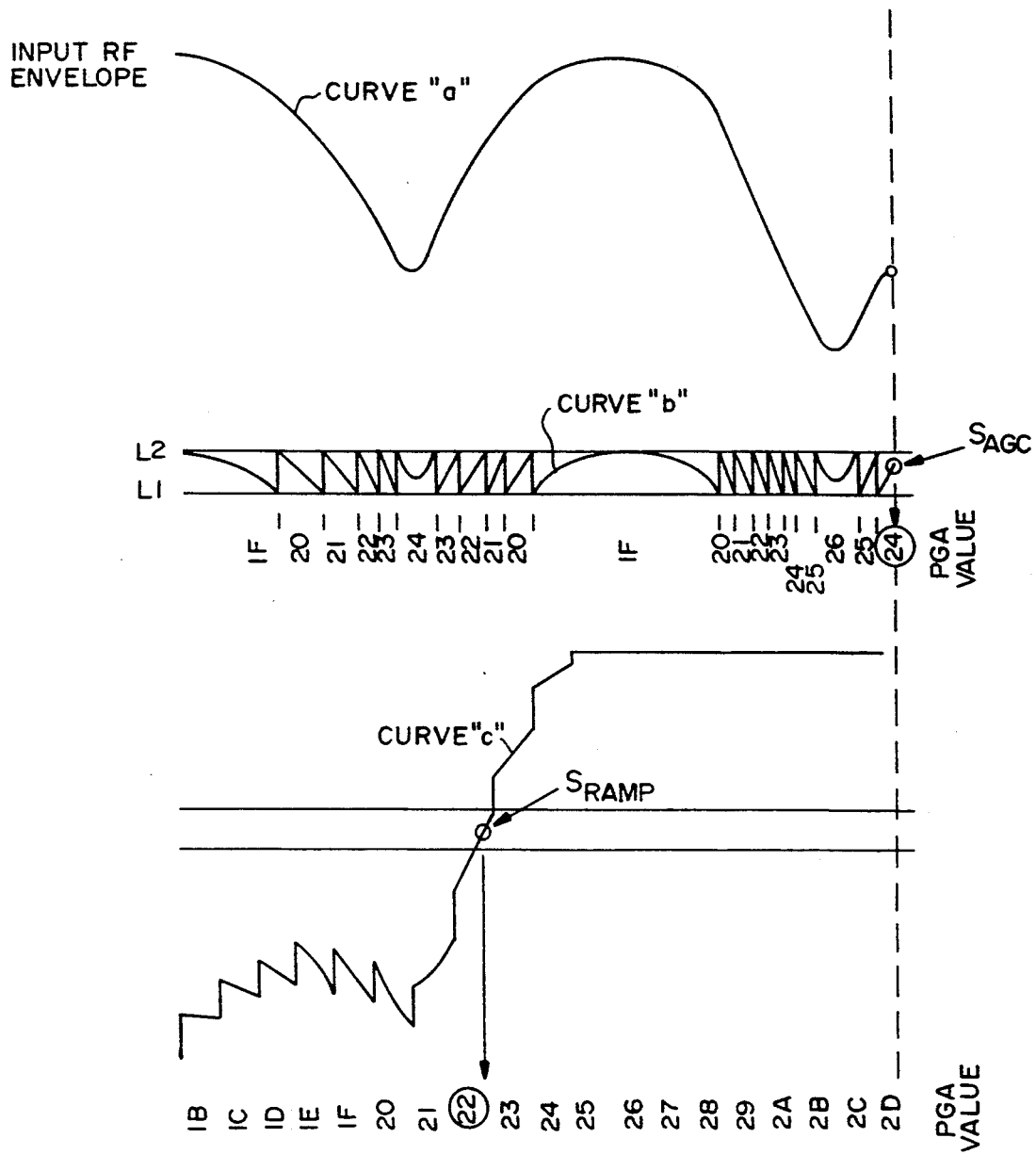
FIG. 2 is a graph on which is plotted the amplitude (dB) of a received-communication-signal envelope (curve "a"), the amplitude (dB) of a variable-gain-amplifier ("VGA") output signal envelope as controlled by an AGC signal in a closed-feedback-loop arrangement (curve "b"), and the amplitude (dB) of a VGA output signal envelope as controlled by a ramp signal in an open-loop feedback arrangement (curve "c"), in each case, against time in accordance with a preferred embodiment of the RSSI-value generation technique of FIG. 1.

A better understanding of the operation of the AGC-and-RSSI-values generating arrangement 22 can be had with additional reference to the curves of FIG. 2. In FIG. 2, curve "a" depicts the envelope of a sinusoidal radio-frequency signal received by the receiver 10, with amplitude (in dB) plotted against time; curve "b" shows the amplitude (dB) of the envelope of an output signal from the VGA, which has the received signal of curve "a" as its input signal, and is controlled by an AGC signal; and curve "c" illustrates the envelope amplitude (dB) of the output signal of the VGA, which has the received signal of curve "a" as its input signal and is controlled by a ramp signal.

As illustrated in curve "b," when the AGC signal is provided to the VGA, it maintains the VGA output envelope within the limits of a pre-selected window (e.g., 0 dB+/0.5 dB), and thus between a lower amplitude threshold or limit L1 (e.g., 0.95), and an upper limit L2 (e.g., 1.05).

Curve "b" will now be described, starting from the left-hand side of the graph. While the VGA control signal from the AGC has a hexadecimal value of 1F (arbitrary units), curve "b" traces a path following the negative slopes of the corresponding portion of curve "a" appearing immediately above it. When the lower limit L1 is reached, the VGA control value changes to 20, which causes curve "b" to jump up to the upper limit L2, and then resume its tracing of curve "a." This is repeated for the next few intervals, in which the VGA control values are 21 through 23.

Then, while the VGA control value assumes its next value of 24, the received signal undergoes a change from a negative slope to a positive slope, and, curve "b," after dipping down towards the lower limit L1, extends to the upper limit L2. There, the VGA control value changes to 23, causing curve "b" to jump down to the lower limit L1. Thereafter, this procedure continues, with the VGA control values decreasing to maintain amplitudes of curve "b" within the limits of L1 and L2 for the balance of the sinusoidal cycle of the received signal.

When curve "b" next undergoes a change from a positive to a negative slope, the VGA control values start to increase again. This procedure of controlling the VGA output is repeated, cycle after cycle, for the entire time that the signal of curve "a" is received.

With continued reference to curve "b," an indication of signal strength can be generated using a closed-feedback-loop technique by using a VGA control value $S_{AGC}$ that occurs at the end of a selected period of time (which is sufficient in length for the loop to reach equilibrium) as a pointer into the look-up table in memory 54. In curve "b," the pointer value of the VGA control signal corresponding to $S_{AGC}$ has a numeric value of 24.

The look-up table is calibrated to provide a useful RSSI value for that pointer.

Curve c of FIG. 2 depicts the output of the VGA under the influence of a digital-ramp control signal, such as that shown in FIG. 1 at the output of the ramp generator 52. In curve "c," between control signal values of IB to IE, when the received signal of curve "a" has a modest negative slope, the VGA output generally increases (subject to the aforementioned jumps). Thereafter, for control values of IF and 20, during which the negative slope of the received signal of curve "a" is relatively large, the VGA output generally decreases. Then, for control values between 21 and 24, when the received signal has a positive slope, the VGA output has a relatively large positive slope. For control values larger than 24, the VGA output remains flat because the VGA has reached saturation (e.g., 5 volts).

With continued reference to curve "c," and in accordance with a preferred embodiment of the invention, an open-loop technique for generating an indication of signal strength uses the VGA control value occurring when the VGA output reaches a pre-selected level, i.e., $S_{RAMP}$, as a pointer into the look-up table in memory 54. As illustrated, $S_{RAMP}$ is, for example, 0.1 volts, and the pointer value of the VGA control signal corresponding to $S_{RAMP}$ has a numeric value of 22. As before, the look-up table is calibrated to provide a useful RSSI value for that pointer.

It should be noted that the time that it takes the VGA output to reach $S_{RAMP}$ is governed by the slope of the ramp signal, and that slope can be selected so that $S_{RAMP}$ is reached quickly. On the other hand, the closed-loop technique of curve "b" requires the passage of a sufficient period of time for the loop to settle. Accordingly, the open-loop technique illustrated in curve "c" can obtain an RSSI value faster than the closed-loop technique of curve "b."

Because of this time advantage, the open-loop technique is particularly well suited for use in digital radio-telephones that are subscribers on cellular telephone systems that employ mobile-assisted hand-off ("MAHO"). Cellular systems of the type contemplated employ base stations (not shown), which can accommodate a plurality (e.g., three) mobile units for each radio-frequency carrier by time multiplexing communication with each, i.e., periodically communicating with each, one after the other.

Figure 3:
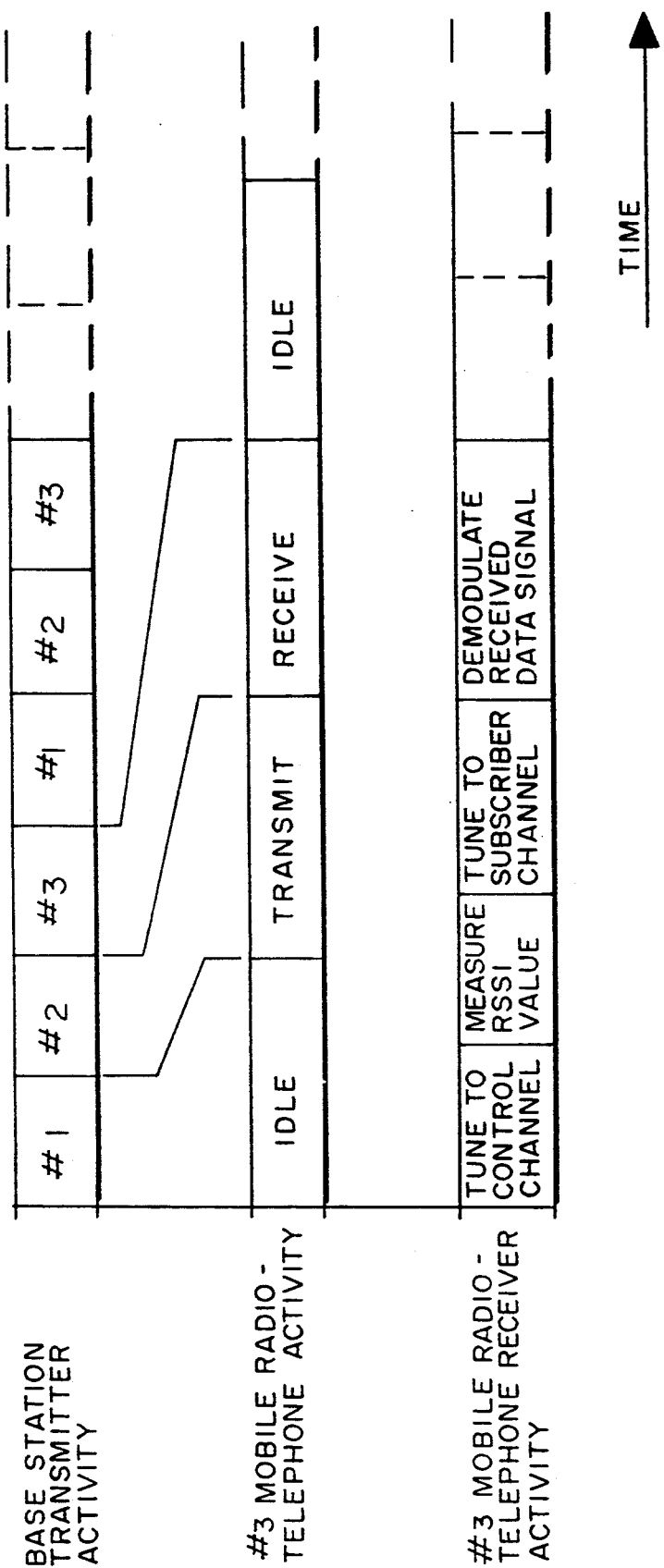
FIG. 3 is an illustration of the operation of a cellular telephone system including a base station and radio-telephones each employing the receiver of FIG. 1.

The operation of such a cellular system is illustrated in FIG. 3. The top of the drawing shows base station transmitter activity over time. The base station transmits to radio-telephone #1, then to radio-telephone #2, and subsequently to radio-telephone #3, before repeating this cycle and communicating again to radio-telephone #1, etc. Preferably, each of these radio-telephones employ a receiver of the type shown in FIG. 1.

The middle of FIG. 3 depicts the data (i.e., voice) activity of radio-telephone #3 on an expanded scale. While the base station is transmitting to radio-telephone #1, radio-telephone #3 is in an IDLE ("I") mode or time slot. While the base station is transmitting to radio-telephone #2, radio-telephone #3 is in a TRANSMIT ("T") mode or time slot, during which it can transmit messages. Finally, while the base station is transmitting to radio-telephone #3, it is in a RECEIVE ("R") mode or time slot, and is receiving and demodulating signals from the base station.

The bottom of FIG. 3 represents the receiver activity of radio-telephone #3. Note that while radio-telephone #3 is in the I and T modes, its receiver tunes to a first MAHO channel, e.g., within 5 msec, generates an RSSI value for that channel, e.g., within 3.4 msec, and tunes back to a subscriber channel, e.g., within 5 msec. While radio-telephone #3 is in the R mode, it demodulates the incoming signal, e.g., within 6.7 msec.

With these time constraints imposed by various international standards, the time available to generate RSSI values is limited. Employing the present invention in deriving RSSI-values in an open-loop technique can more readily satisfy these time requirements, compared to the closed-loop technique described above. Furthermore, the RSSI-value can be generated in less time than the 3.4 msec alotted, and accordingly, more time can be provided to synthesizer switching to the MAHO and subscriber channels.

Of course, it is necessary to synchronize the operation of the ramp generator 52 to the time slots during which the RSSI-values are to be generated. Accordingly, the above-described select an synchronizing signals provided by the central processing unit 24 (FIG. 1) are generated in response to information obtained from the control channel signal, which identifies the starting and ending times of the R, I and T time slots.

The foregoing description has been limited to specific embodiments of this invention. It will be apparent, however, that variations and modifications may be made to the invention, while continuing to attain some or all of its advantages. Therefore, it is the object of the appended claims to cover all such variations and modifications as come within the true spirit and scope of the invention.

What is claimed as new and desired to be secured by Letters Patent is:

1. A digital radio-telephone receiver employing an open-loop arrangement for generating a received-signal-strength-indicating ("RSSI") value suitable for use in mobile assisted hand-off ("MAHO") within a cellular telephone system, said receiver comprising: an amplifier for amplifying a received signal with a gain controlled by a gain-control signal so as to produce an amplifier output having amplitudes defining a signal envelope, an automatic-gain-control circuit responsive to the amplitude of the amplifier output and coupled in a feedback loop for applying an automatic-gain-control-circuit output signal to a control input of the amplifier as the gain-control signal, and means for generating an RSSI value by (i) opening the automatic-gain-control-circuit feedback loop, so that the automatic-gain-control-circuit output signal is not supplied to the amplifier, during a first period of time, (ii) during said first period of time, applying a ramp signal of increasing amplitude to the amplifier while the automatic-gain-control-circuit monitors the signal envelope, and (iii) when the signal envelope passes a pre-selected threshold, applying the then-occurring ramp-signal value to a look-up table to obtain the corresponding RSSI value stored therein.

2. The radio-telephone receiver in accordance with claim 1, wherein the RSSI-value-generating means comprises: a digital multiplexer, which provides to the amplifier as the gain-control signal, in response to a select signal, the ramp signal during said first period of time, and the automatic-gain-control-circuit output signal during a second period of time.

3. The radio-telephone receiver in accordance with claim 2, wherein, in a RECEIVE time slot when the receiver is demodulating received communication signals, the select signal causes the digital multiplexer to pass the automatic-gain-control-circuit output signal to the amplifier, and, in TRANSMIT and IDLE time slots, the select signal causes the digital multiplexer to pass the ramp signal for generating the RSSI value.

4. The radio-telephone receiver in accordance with claim 3, further comprising a processor for generating said select signal in response to information obtained from a received control channel signal that identifies the starting and ending times of the RECEIVE, IDLE and TRANSMIT time slots.

5. The radio-telephone receiver in accordance with claim 3, further comprising memory means for storing said look-up table.

6. The arrangement in accordance with claim 1, further comprising a ramp generator including a digital counter for generating the ramp signal, and wherein said ramp signal comprises a series of steps of increasing amplitude.

7. In a digital mobile radio-telephone, a receiver comprising:
   A) means for tuning said receiver to a selected channel,
   B) an amplifier coupled to said tuning means for amplifying a signal received over the selected channel, said amplifier having a control input, the amplification gain of said amplifier being response to a control signal applied to said control input,
   C) a mixer coupled to said amplifier for generating baseband signals from the amplifier output,
   D) an analog-to-digital converter coupled to said mixer for generating digital baseband signals, said digital baseband signals being characterized by signal envelopes,
   E) a decoder coupled to said analog-to-digital converter for recovery of data from the digital baseband signals,
   F) a processor coupled to said tuning means,
   G) an automatic gain control circuit coupled to said analog-to-digital converter and said processor for monitoring the digital baseband signals, generating an automatic-gain-control-circuit signal from the digital baseband signals, said automatic-gain-control-circuit signal being responsive to the amplitudes of the envelopes of said digital baseband signals, and
   H) means for generating an RSSI value, including a memory storing a look-up table of RSSI values, and a ramp generator coupled to said amplifier, said processor and said memory for applying a ramp signal of increasing amplitude to said amplifier control input, and for applying the ramp value occurring when the signal envelope passes a preselected threshold to said look-up table memory to obtain the corresponding RSSI value stored therein.

8. In a digital mobile radio-telephone, a receiver comprising:
   A) means for tuning the receiver to a selected channel,
   B) an amplifier coupled to said tuning means for amplifying a signal received over the selected channel, said amplifier having a control input, the amplification gain of said amplifier being response to a control signal applied to said control input,
   C) a mixer coupled to said amplifier for generating baseband signals from the amplifier output,
   D) an analog-to-digital converter coupled to said mixer for generating digital baseband signals, said digital baseband signals being characterized by signal envelopes,
   E) a decoder coupled to said analog-to-digital converter for recovery of data from the digital baseband signals,
   F) a processor coupled to said tuning means,
   G) an automatic gain control circuit coupled to said analog-to-digital converter and said processor for monitoring the digital baseband signals, generating an automatic-gain-control-circuit signal from the digital baseband signals, said automatic-gain-control-circuit signal being responsive to the amplitudes of the envelopes of said digital baseband signals, and
   H) means for generating an RSSI value, including
      i) a memory storing a look-up table of RSSI values,
      ii) a ramp generator coupled to said amplifier, said processor and said memory for generating a ramp signal of increasing amplitude, and
      iii) a multiplexer for passing one of said ramp signal and said automatic-gain-control-circuit signal to said amplifier control input in response to a select signal, and for applying the ramp value occurring when the signal envelope passes a preselected threshold to said look-up table memory to obtain the corresponding RSSI value stored therein.

9. The arrangement in accordance with claim 8, further comprising a processor for generating the select signal and for receiving a signal from the automatic-gain-control circuit that indicates that the pre-selected threshold has been reached.

10. For generating a received-signal-strength-indicating value suitable for use in mobile-radio-telephone-assisted hand-off within a cellular telephone system, an arrangement comprising:
   A) a variable-gain amplifier for amplifying a received signal with a gain controlled by a gain-control signal so as to produce an amplifier output having amplitudes defining a signal envelope;
   B) An automatic-gain-control circuit coupled with the amplifier for monitoring the signal envelope of the amplifier output and generating an automatic-gain-control signal responsive to the amplitude of the amplifier output;
   C) selecting means coupled with the automatic-gain-control circuit and a ramp-generating means and responsive to a select signal for passing one of the automatic-gain-control signal and a ramp signal having increasing amplitudes to a control input of the amplifier; wherein, when the automatic-gain-control signal is passed to the amplifier, the automatic-gain-control signal causes the amplifier output to remain within a pre-selected range; and
   D) a memory for storing a look-up table of received-signal-strength-indicating values corresponding to ramp-signal values, the selecting means applying the ramp-signal value occurring when the signal envelope passes a pre-selected threshold to the memory for obtaining the corresponding received-signal-strength-indicating value stored therein.

11. The arrangement in accordance with claim 10, wherein the selecting means comprises a digital multiplexer for providing to the amplifier as the gain-control signal, in response to a select signal, the ramp signal during a first period of time, and the automatic-gain-control-circuit output signal during a second period of time.

12. The arrangement in accordance with claim 10, further comprising a ramp generator including a digital counter for generating the ramp signal, and wherein the ramp signal comprises a series of steps of increasing amplitude.

13. For generating a received-signal-strength-indicating value suitable for use in mobile-radio-telephone-assisted hand-off within a cellular telephone system, a method comprising the steps of:
   A) amplifying a received signal in an amplifier with a gain controlled by a gain-control signal so as to produce an amplifier output having amplitudes defining a signal envelope;
   B) monitoring the signal envelope of the amplifier output and generating an automatic-gain-control signal responsive to the amplitude of the amplifier output;
   C) generating a ramp signal having increasing amplitude;
   D) responsive to a select signal, passing one of the automatic-gain-control signal and the ramp signal to a control input of the amplifier;
   E) wherein, when the automatic-gain-control signal is passed to the amplifier, the automatic-gain-control signal causes the amplifier output to remain within a pre-selected range;
   F) storing a plurality of received-signal-strength-indicating values corresponding to ramp-signal values in a memory; and
   G) applying the ramp-signal value occurring when the signal envelope passes a pre-selected threshold to the memory for obtaining the corresponding received-signal-strength-indicating value stored therein.

14. The method in accordance with claim 13, further comprising the step of providing to the amplifier as the gain-control signal, in response to a select signal, the ramp signal during a first period of time, and the automatic-gain-control-circuit output signal during a second period of time.

* * * * *